(12) United States Patent
Choi et al.

(10) Patent No.: US 12,242,732 B2
(45) Date of Patent: Mar. 4, 2025

(54) SEMICONDUCTOR APPARATUS WITH PROGRAM OPERATION CONTROL

(71) Applicant: SK hynix Inc., Icheon-si (KR)

(72) Inventors: Hyung Jin Choi, Icheon-si (KR); Gwi Han Ko, Icheon-si (KR); Chan Hui Jeong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 206 days.

(21) Appl. No.: 17/983,115

(22) Filed: Nov. 8, 2022

(65) Prior Publication Data

US 2023/0400986 A1    Dec. 14, 2023

(30) Foreign Application Priority Data

Jun. 8, 2022 (KR) .......................... 10-2022-0069413

(51) Int. Cl.
*G11C 16/10* (2006.01)
*G06F 3/06* (2006.01)
*G11C 5/14* (2006.01)
*G11C 11/409* (2006.01)
*G11C 16/34* (2006.01)

(52) U.S. Cl.
CPC .......... *G06F 3/0616* (2013.01); *G06F 3/0629* (2013.01); *G06F 3/0679* (2013.01); *G11C 5/141* (2013.01); *G11C 11/409* (2013.01); *G11C 16/3436* (2013.01)

(58) Field of Classification Search
CPC ..... G06F 3/0616; G06F 3/0679; G11C 5/141; G11C 11/409; G11C 16/3436
See application file for complete search history.

(56) References Cited

U.S. PATENT DOCUMENTS

| | | | |
|---|---|---|---|
| 2015/0146485 A1* | 5/2015 | Kim ................... | G11C 16/3454 365/185.03 |
| 2018/0081414 A1* | 3/2018 | Kojima ................ | G06F 1/30 |
| 2022/0148658 A1* | 5/2022 | Choi .................... | G11C 11/5671 |
| 2023/0071618 A1 | 3/2023 | Shin et al. | |
| 2023/0112849 A1* | 4/2023 | Kim ........................ | H01L 25/18 365/185.03 |

* cited by examiner

*Primary Examiner* — Min Huang
(74) *Attorney, Agent, or Firm* — WILLIAM PARK & ASSOCIATES LTD.

(57) ABSTRACT

A semiconductor apparatus includes a memory cell array and a control circuit. The control circuit is configured to perform a program operation on target cells within the memory cell array, the program operation including a plurality of loops. The control circuit may be configured to apply a bit line voltage having a predetermined level to bit lines in loops in which a pass voltage having a first level is applied among the plurality of loops, and configured to apply the bit line voltage having a higher level than the predetermined level to the bit lines in loops in which the pass voltage having a second level higher than the first level is applied among the plurality of loops.

12 Claims, 9 Drawing Sheets tEV2 > tEV1(PL1~PLm) > tEV1(PLm+1~PLn)

tEV1 < tEV2(PL1~PLm) < tEV2(PLm+1~PLn)

SEMICONDUCTOR APPARATUS WITH PROGRAM OPERATION CONTROL

CROSS-REFERENCE TO RELATED APPLICATION

The present application claims priority under 35 U.S.C. § 119(a) to Korean application number 10-2022-0069413, filed on Jun. 8, 2022, in the Korean Intellectual Property Office, which is incorporated herein by reference in its entirety as set forth in full.

BACKGROUND

1. Technical Field

Various embodiments generally relate to a semiconductor circuit, and, more particularly, to a semiconductor apparatus capable of controlling a program operation.

2. Related Art

A semiconductor apparatus, for example, a memory device may be classified into a volatile memory device and a non-volatile memory device. The non-volatile memory device may keep data stored therein even when a power supply is interrupted. Therefore, because data is kept regardless of the power supply, the non-volatile memory device is widely utilized in various portable electronic devices.

According to a scheme to store data therein, the non-volatile memory may be classified into a read only memory (ROM), a mask ROM, a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM) and so forth.

The flash memory does not need a refresh function of periodically re-storing data stored therein, which is different from the volatile memory and thus, causes an increase in demand for the flash memory. The flash memory is capable of electrically programming and erasing data. As one of the schemes for the program operation, double verification program operation (DPGM) may be utilized to perform a verification operation with two (2) verification voltage levels.

There may be lots of target cells, i.e., memory cells to be programmed in an early stage of the program operation but this may increase memory cells not to be programmed in a later stage of the program operation, which causes characteristic degradation of a program operation. Accordingly, what is required is a technology for preventing or mitigating the characteristic degradation of the program operation.

SUMMARY

In an embodiment, a semiconductor apparatus may include a memory cell array and a control circuit. The control circuit may be configured to perform a program operation on target cells within the memory cell array, the program operation including a plurality of loops. The control circuit may be configured to apply a bit line voltage having a predetermined level to bit lines in loops in which a pass voltage having a first level is applied among the plurality of loops, and configured to apply the bit line voltage having a higher level than the predetermined level to the bit lines in loops in which the pass voltage having a second level higher than the first level is applied among the plurality of loops.

In an embodiment, a semiconductor apparatus may include a memory cell array and a control circuit. The control circuit may be configured to perform a program operation on target cells within the memory cell array, the program operation including a plurality of loops. The control circuit may be configured to perform, during the program operation, at least one of a first program control operation and a second program control operation. The control circuit may be configured to perform the first program control operation by applying a bit line voltage having a first predetermined level to bit lines in loops in which a pass voltage having a first level is applied among the plurality of loops, and by applying the bit line voltage having a higher level than the first predetermined level to the bit lines in loops in which the pass voltage having a second level higher than the first level is applied among the plurality of loops. The control circuit may be configured to perform the second program control operation by applying the bit line voltage having a lower level than a second predetermined level to the bit lines in loops before pass-determination occurs as a result of a verification operation among the plurality of loops and by applying the bit line voltage having the second predetermined level to the bit lines in a loop in which the pass-determination occurs as the result of the verification operation and subsequent loops among the plurality of loops.

In an embodiment, a semiconductor apparatus may include a memory cell array and a control circuit. The control circuit may be configured to perform a program operation on target cells within the memory cell array, the program operation including a plurality of loops. The control circuit may be configured to perform, during the program operation, at least one of a first program control operation, a second program control operation and a third program control operation. The control circuit may be configured to perform the first program control operation by applying a bit line voltage having a first predetermined level to bit lines in loops in which a pass voltage having a first level is applied among the plurality of loops, and by applying the bit line voltage having a higher level than the first predetermined level to the bit lines in loops in which the pass voltage having a second level higher than the first level is applied among the plurality of loops. The control circuit may be configured to perform the second program control operation by applying the bit line voltage having a lower level than a second predetermined level to the bit lines in loops before pass-determination occurs among the plurality of loops and by applying the bit line voltage having the second predetermined level to the bit lines in a loop in which the pass-determination occurs and subsequent loops among the plurality of loops. The control circuit may be configured to perform the third program control operation by varying at least one of a first evaluation time amount for a first verification operation and a second evaluation time amount for a second verification operation, the first verification operation and the second verification operation being included in a double verification operation performed in the plurality of loops.

DETAILED DESCRIPTION

In accordance with an embodiment, provided may be a semiconductor apparatus capable of controlling a program operation to prevent or mitigate the characteristic degradation of program operation.

Hereinafter, embodiments of the present disclosure will be described below with reference to the accompanying drawings.

Figure 1:
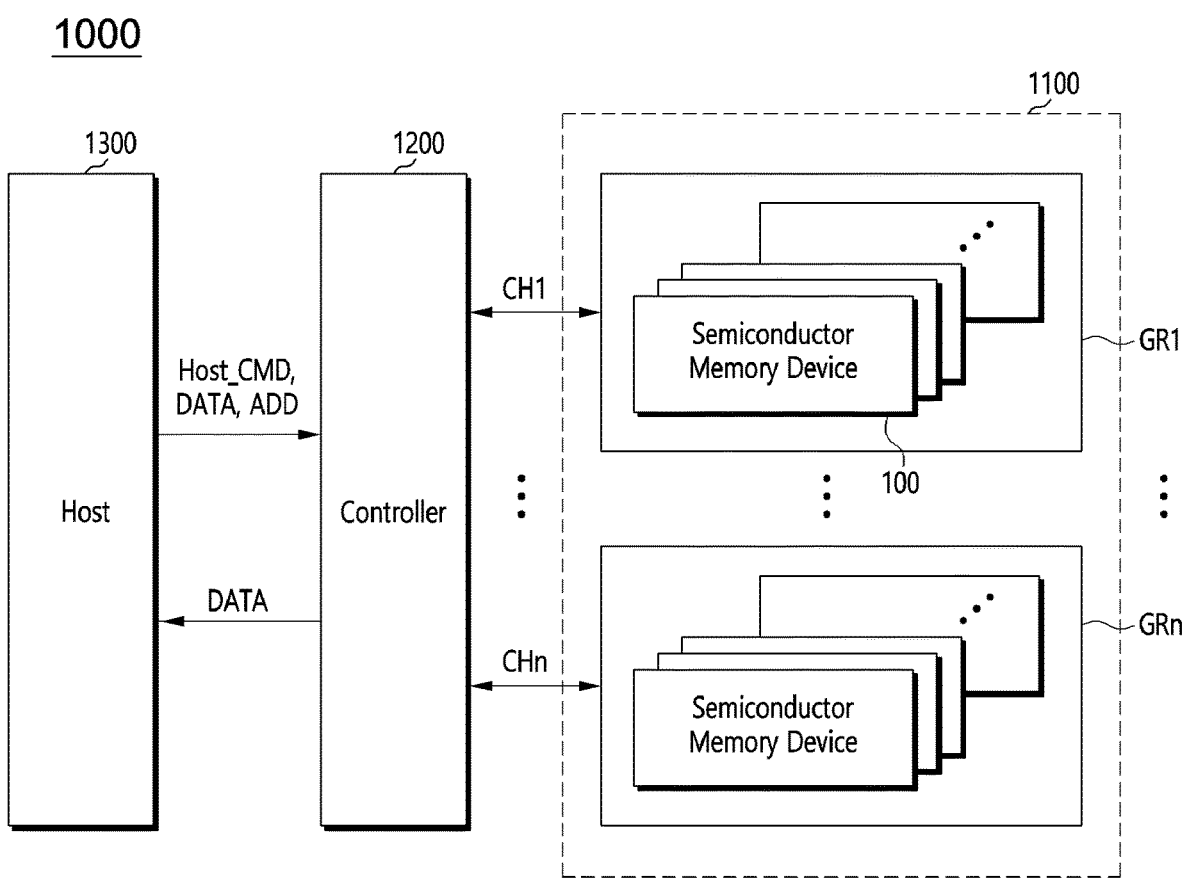
FIG. 1 is a diagram illustrating a configuration of a memory system including a memory device in accordance with an embodiment.

FIG. 1 is a diagram illustrating a configuration of a memory system 1000 including a memory device in accordance with an embodiment.

Referring to FIG. 1, the memory system 1000 may include a memory device 1100, a controller 1200 and a host 1300. The memory device 1100 may include a plurality of semiconductor apparatus, for example, a plurality of semiconductor memory devices 100. The plurality of semiconductor memory devices 100 may be divided into a plurality of groups GR1 to GRn. The plurality of groups GR1 to GRn may communicate with the controller 1200 through first to n-th channels CH1 to CHn, respectively. Although FIG. 1 exemplifies the host 1300 as included within the memory system 1000, the memory system 1000 may only include the controller 1200 and the memory device 1100 and the host 1300 may be disposed outside the memory system 1000.

Through the plurality of channels CH1 to CHn, the controller 1200 may be configured to control the plurality of semiconductor apparatus of the memory device 1100, e.g., the semiconductor memory devices 100. The controller 1200 may be coupled between the host 1300 and the memory device 1100. The controller 1200 may be configured to access the memory device 1100 in response to a request from the host 1300. For example, in response to a host command Host_CMD from the host 1300, the controller 1200 may be configured to control the read operation, program operation, erase operation and verification operation of the memory device 1100. During the program operation, the host 1300 may provide the controller 1200 with an address ADD and to-be-programmed data DATA together with the host command Host_CMD. During the read operation, the host 1300 may provide the controller 1200 with an address ADD together with the host command Host_CMD. During the program operation, the controller 1200 may provide the memory device 1100 with the to-be-programmed data DATA together with a command corresponding to the program operation. During the read operation, the controller 1200 may provide the memory device 1100 with a command corresponding to the read operation, may receive data DATA read from the memory device 1100 and may provide the host 1300 with the read data DATA. The controller 1200 may be configured to provide an interface between the memory device 1100 and the host 1300.

In an embodiment, the memory device 1100 or the memory system 1000 may be mounted on various types of packages. For example, the memory device 1100 or the memory system 1000 may be mounted through various packaging schemes such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP) and so forth.

Figure 2:
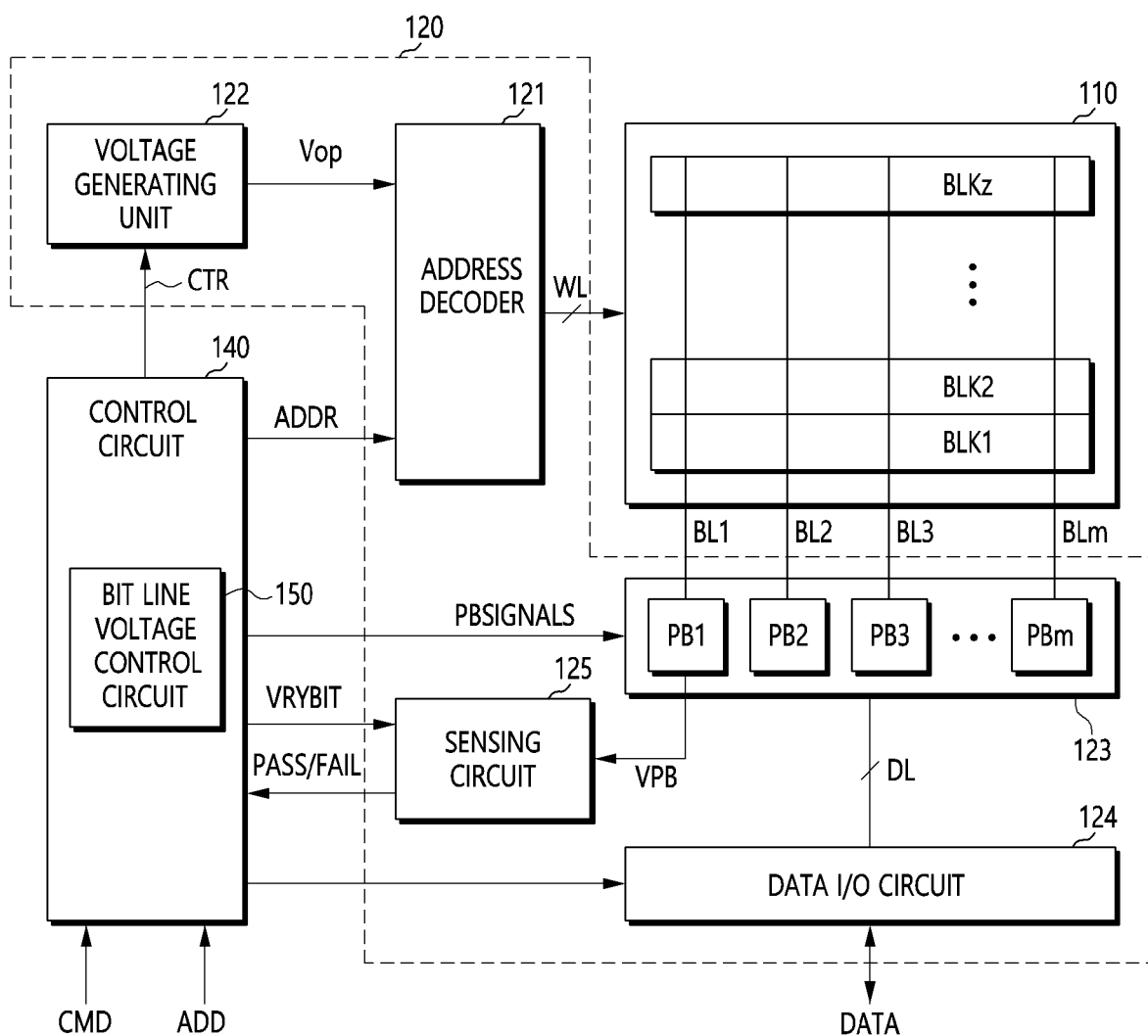
FIG. 2 is a diagram illustrating a configuration of a semiconductor memory device illustrated in FIG. 1.

FIG. 2 is a diagram illustrating a configuration of the semiconductor memory device 100 illustrated in FIG. 1.

Referring to FIG. 2, the semiconductor memory device 100 may include a memory cell array 110, a peripheral circuit 120 and a control circuit 140. The control circuit 140 may be implemented as hardware, software, or a combination of hardware and software.

The memory cell array 110 may include a plurality of memory blocks BLK1 to BLKz. The plurality of memory blocks BLK1 to BLKz may be coupled to an address decoder 121 through row lines, e.g., word lines WL. The plurality of memory blocks BLK1 to BLKz may be coupled to a read and write circuit 123 through bit lines BL1 to BLm. Each of the plurality of memory blocks BLK1 to BLKz may include a plurality of memory cells. In an embodiment, the plurality of memory cells may be non-volatile memory cells. A physical page may be defined as memory cells coupled to the same word line among the plurality of memory cells. That is, the memory cell array 110 may be configured by a plurality of pages. Each memory cell of the semiconductor memory device 100 may be implemented as a single level cell (SLC) capable of storing therein a single data bit, a multiple level cell (MLC) capable of storing therein two (2) data bits, a triple level cell (TLC) capable of storing therein three (3) data bits or a quadruple level cell (QLC) capable of storing therein four (4) data bits.

The peripheral circuit 120 may drive the memory cell array 110. For example, the peripheral circuit 120 may drive the memory cell array 110 to perform program operation, read operation and erase operation. The peripheral circuit 120 may include the address decoder 121, a voltage generating unit 122, the read and write circuit 123 and a data input/output (I/O) circuit 124.

The address decoder 121 may be coupled to the memory cell array 110 through the word lines WL. The address decoder 121 may be configured to operate under the control of the control circuit 140. The address decoder 121 may receive an address ADDR from the control circuit 140. The address decoder 121 may be configured to decode a block address within the received address ADD. According to the decoded block address, the address decoder 121 may select at least one of the memory blocks BLK1 to BLKz. The address decoder 121 may be configured to decode a row address within the received address ADD. According to the decoded row address, the address decoder 121 may select at least one word line coupled to the selected memory block by applying, to at least one word line, voltages provided from the voltage generating unit 122. The address decoder 121 may be configured to decode a column address within the received address ADD. The decoded column address may be provided to the read and write circuit 123. The address decoder 121 may include elements such as row decoder, column decoder, address buffer and so forth.

During a program operation of the semiconductor memory device 100, the address decoder 121 may apply a program voltage to the selected word line and may apply a pass voltage, which has a lower level than the program voltage, to non-selected word lines. During a program verification operation of the semiconductor memory device 100, the address decoder 121 may apply a verification voltage to the selected word line and may apply a verification pass voltage, which has a higher level than the verification voltage, to the non-selected word lines. During a read operation of the semiconductor memory device 100, the address decoder 121 may apply a read voltage to the selected word line and may apply a read pass voltage, which has a higher level than the read voltage, to the non-selected word lines. During an erase operation of the semiconductor memory device 100, the address decoder 121 may select a memory block by decoding a block address and may apply a ground voltage to word lines coupled to the selected memory block.

The voltage generating unit 122 may be configured to generate a plurality of voltages by utilizing an external power voltage provided to the semiconductor memory device 100. The voltage generating unit 122 may operate under the control of the control circuit 140, for example, in response to a voltage control signal CTR. The voltage generating unit 122 may generate the plurality of voltages by utilizing the external power voltage. The plurality of voltages generated by the voltage generating unit 122 may be utilized as operating voltages within the semiconductor memory device 100. The plurality of voltages generated by the voltage generating unit 122 may include a plurality of erase voltages, a plurality of program voltages, a plurality of pass voltages, a plurality of selected read voltages and a plurality of non-selected read voltages. The plurality of voltages generated by the voltage generating unit 122 may be provided to the memory cell array 110 by the address decoder 121.

The read and write circuit 123 may include first to m-th page buffers PB1 to PBm. The first to m-th page buffers PB1 to PBm may be coupled to the memory cell array 110 respectively through first to m-th bit lines BL1 to BLm. The first to m-th page buffers PB1 to PBm may operate under the control of the control circuit 140. The first to m-th page buffers PB1 to PBm may exchange data DATA with the data I/O circuit 124. During a program operation of the semiconductor memory device 100, the first to m-th page buffers PB1 to PBm may receive to-be-stored data DATA through the data I/O circuit 124 and data lines DL. During a program operation of the semiconductor memory device 100, the first to m-th page buffers PB1 to PBm may transfer, through the bit lines BL1 to BLm, the to-be-stored data DATA from the data I/O circuit 124 to selected memory cells. According to the transferred data DATA, the memory cells of selected pages may be programmed. A memory cell coupled to a bit line, to which a program-permission voltage (e.g., a ground voltage) is applied, may have an elevated threshold voltage. A memory cell coupled to a bit line, to which a program-inhibition voltage (e.g., a power voltage) is applied, may keep a threshold voltage. During a program verification operation of the semiconductor memory device 100, the first to m-th page buffers PB1 to PBm may read data DATA from the selected memory cells through the bit lines BL1 to BLm. During a read operation of the semiconductor memory device 100, the read and write circuit 123 may read data DATA from the memory cells of the selected pages through the bit lines BL1 to BLm and may store the read data DATA into the first to m-th page buffers PB1 to PBm. During an erase operation of the semiconductor memory device 100, the read and write circuit 123 may float the bit lines BL1 to BLm. The read and write circuit 123 may include a column selecting circuit.

The data I/O circuit 124 may be coupled to the first to m-th page buffers PB1 to PBm through the data lines DL. The data I/O circuit 124 may operate under the control of the control circuit 140. The data I/O circuit 124 may include a plurality of I/O buffers (not illustrated) configured to receive data DATA. During a program operation of the semiconductor memory device 100, the data I/O circuit 124 may receive to-be-stored data DATA from an exterior, e.g., the controller 1200. During a read operation of the semiconductor memory device 100, the data I/O circuit 124 may transfer data DATA to the controller 1200 from the first to m-th page buffers PB1 to PBm included in the read and write circuit 123.

During a read operation or a verification operation of the semiconductor memory device 100, the sensing circuit 125 may generate a reference current in response to a permission bit signal VRYBIT generated by the control circuit 140 and may compare a sensing voltage VPB from the read and write circuit 123 and a reference voltage, which is generated from the reference current, to output a pass/fail signal PASS/FAIL to the control circuit 140. The sensing circuit 125 may include a current sensing circuit configured to count a number of fail-bits or a number of cells, on which a program operation fails among target cells.

The control circuit 140 may be coupled to the address decoder 121, the voltage generating unit 122, the read and write circuit 123, the data I/O circuit 124 and the sensing circuit 125. The control circuit 140 may be configured to control overall operation of the semiconductor memory device 100. The control circuit 140 may operate in response to a command CMD from an external device. In response to a command CMD and an address ADD, the control circuit 140 may generate various signals to control the peripheral circuit 120. In response to a command CMD and an address ADD, the control circuit 140 may generate the voltage control signal CTR, a row address ADDR, a read and write circuit control signal PBSIGNALS and the permission bit signal VRYBIT. In response to the pass/fail signal PASS/FAIL from the sensing circuit 125, the control circuit 140 may determine whether a verification operation is of fail or pass.

The control circuit 140 may perform, on target cells within the memory cell array, a program operation comprising a plurality of loops. As one of program operation schemes, utilized may be a double verification program operation (DPGM) that is a verification operation performed with two (2) verification voltage levels. During a program operation, the control circuit 140 may be configured to perform at least one of first program control operation, second program control operation and third program control operation. Each of the plurality of loops on target cells may include a program voltage application operation and a verification operation on the target cells, the verification operation being an operation of determining, by utilizing a plurality of verification voltages, whether the target cells are programmed. During a program operation, the control circuit 140 may apply a program voltage to word lines coupled to the target cells and may apply a pass voltage to word lines coupled to non-target cells.

The control circuit 140 may store information of a selected loop and information of an increment of pass voltage. The selected loop may be regarded as a time point when a pass voltage increment mode (VPASS Increment) is applied thereto. That is, the pass voltage increment mode may be applied to the selected loop among the plurality of loops. In the pass voltage increment mode, a pass voltage may have a higher level that a predetermined level. A normal mode may be applied to preceding loops prior to the loop, to which the pass voltage increment mode is applied. In the normal mode, a pass voltage may have the predetermined level. The word "predetermined" as used herein with respect to a parameter, such as a predetermined level, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

During a first program control operation, a bit line voltage having the predetermined level may be applied to the bit lines at first to m-th loops that are performed in the normal pass voltage mode among first to n-th loops and a bit line voltage having a higher level than the predetermined level may be applied to the bit lines at (m+1)-th to n-th loops that are performed in the pass voltage increment mode among the first to n-th loops. For example, 'm' is a natural number greater than zero. For example, 'n' is a natural number greater than 'm.'

During a second program control operation, a bit line voltage having a lower level than the predetermined level may be applied to the bit lines at the first to m-th loops among first to n-th loops and a bit line voltage having the predetermined level may be applied to the bit lines at the (m+1)-th to n-th loops among the first to n-th loops. The first to m-th loops may be loops before the pass-determination occurs as a result of the verification operation. The (m+1)-th to n-th loops may be a loop in which the pass-determination occurs as a result of the verification operation and subsequent loops.

During a third program control operation, a double verification program operation may be performed in the first to n-th loops, the double verification program operation including a first verification operation and a second verification operation. During the third program control operation, one of a first evaluation time amount and a second evaluation time amount, which are respectively for the first verification operation and the second verification operation, may be differently set between a group of the first to m-th loops and a group of the (m+1)-th to n-th loops. In an embodiment for differently setting the first evaluation time amount between the group of the first to m-th loops and the group of the (m+1)-th to n-th loops, the first evaluation time amount may be set to a first value for the first to m-th loops and may be set to a second value for the (m+1)-th to n-th loops, the second value being less than the first value. In this case, the first evaluation time amount may be less than the second evaluation time amount. In an embodiment for differently setting the second evaluation time amount between the group of the first to m-th loops and the group of the (m+1)-th to n-th loops, the second evaluation time amount may be set to a third value for the first to m-th loops and may be set to a fourth value for the (m+1)-th to n-th loops, the fourth value being greater than the third value. In this case, the second evaluation time amount may be greater than the first evaluation time amount. The first to m-th loops may be loops before the pass-determination occurs as a result of the verification operation. The (m+1)-th to n-th loops may be a loop in which the pass-determination occurs as a result of the verification operation and subsequent loops.

The control circuit 140 may include a bit line voltage control circuit 150. The bit line voltage control circuit 150 may be configured to adjust the level of the bit line voltage by adjusting a signal for controlling the page buffers PB1 to PBm under the control of the control circuit 140.

Figure 3:
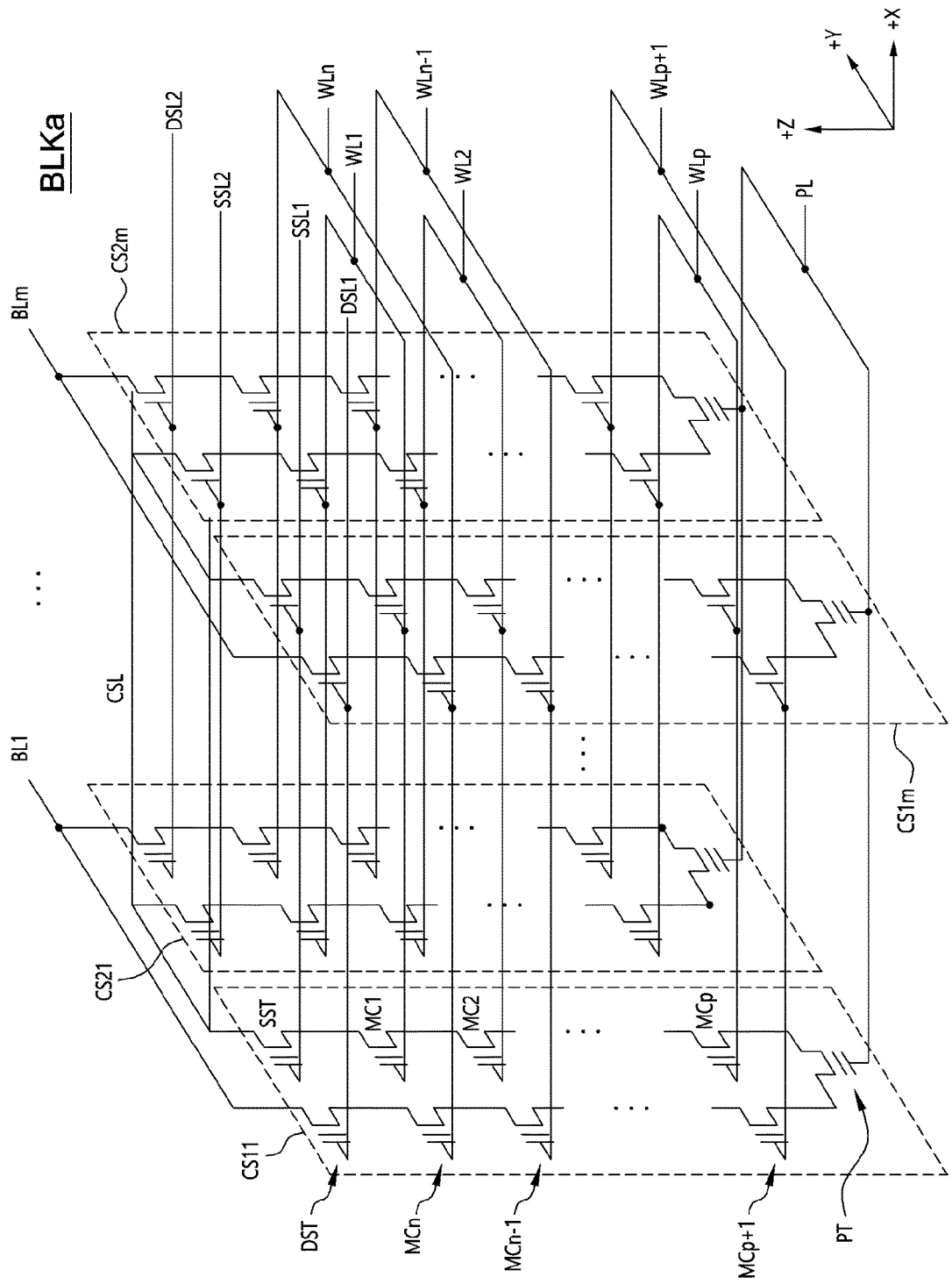
FIG. 3 is a diagram illustrating a configuration of a memory block as one of memory blocks illustrated in FIG. 2.

FIG. 3 is a diagram illustrating a configuration of a memory block BLKa as one of the memory blocks BLK1 to BLKz illustrated in FIG. 2.

Referring to FIG. 3, the memory block BLKa may include a plurality of cell strings CS11 to CS1$m$ and CS21 to CS2$m$. Withing the memory block BLKa, 'm' number of cell strings may be arranged in a row direction (i.e., +X direction). Each of the plurality of cell strings CS11 to CS1$m$ and CS21 to CS2$m$ may include at least one source selection transistor SST, first to n-th memory cells MC1 to MCn, a pipe transistor PT and at least one drain selection transistor DST. The selection transistors SST and DST and the memory cells MC1 to MCn may have similar structures to one another. The source selection transistor SST of each cell string may be coupled between a common source line CSL and the memory cells MC1 to MCp. The first to n-th memory cells MC1 to MCn of each cell string may be coupled between the source selection transistor SST and the drain selection transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp may be sequentially arranged in a reverse direction of +Z direction and may be serially coupled to each other between the source selection transistor SST and the pipe transistor PT. The (p+1)-th to n-th memory cells MCp+1 to MCn may be sequentially arranged in the +Z direction and may be serially coupled to each other between the pipe transistor PT and the drain selection transistor DST. The first to p-th memory cells MC1 to MCp may be coupled to the (p+1)-th to n-th memory cells MCp+1 to MCn through the pipe transistor PT. Respective gates of the first to n-th memory cells MC1 to MCn of each cell string may be coupled to first to n-th word lines WL1 to WLn. A gate of the pipe transistor PT of each cell string may be coupled to a pipeline PL.

The drain selection transistor DST of each cell string may be coupled between a corresponding bit line and the memory cells MCp+1 to MCn. The cell strings arranged in a row direction may be coupled to a drain line, which extends in the row direction. The drain selection transistors DST of the cell strings CS11 to CS inn of the first row may be coupled to a first drain selection line DSL1. The drain selection transistors DST of the cell strings CS21 to CS2$m$ of the second row may be coupled to a second drain selection line DSL2.

Within the cell strings arranged in the row direction, memory cells coupled to the same word line may configure a single page. For example, within the cell strings CS11 to CS1$m$ of the first row, memory cells coupled to the first word line WL1 may configure a single page. Within the cell strings CS21 to CS2$m$ of the second row, memory cells coupled to the first word line WL1 may configure another single page. When one of the drain selection lines DSL1 and DSL2 is selected, cell strings arranged in one of the row directions may be selected. When one of the word lines WL1 to WLn is selected, a single page may be selected within the selected cell strings.

Figure 4:
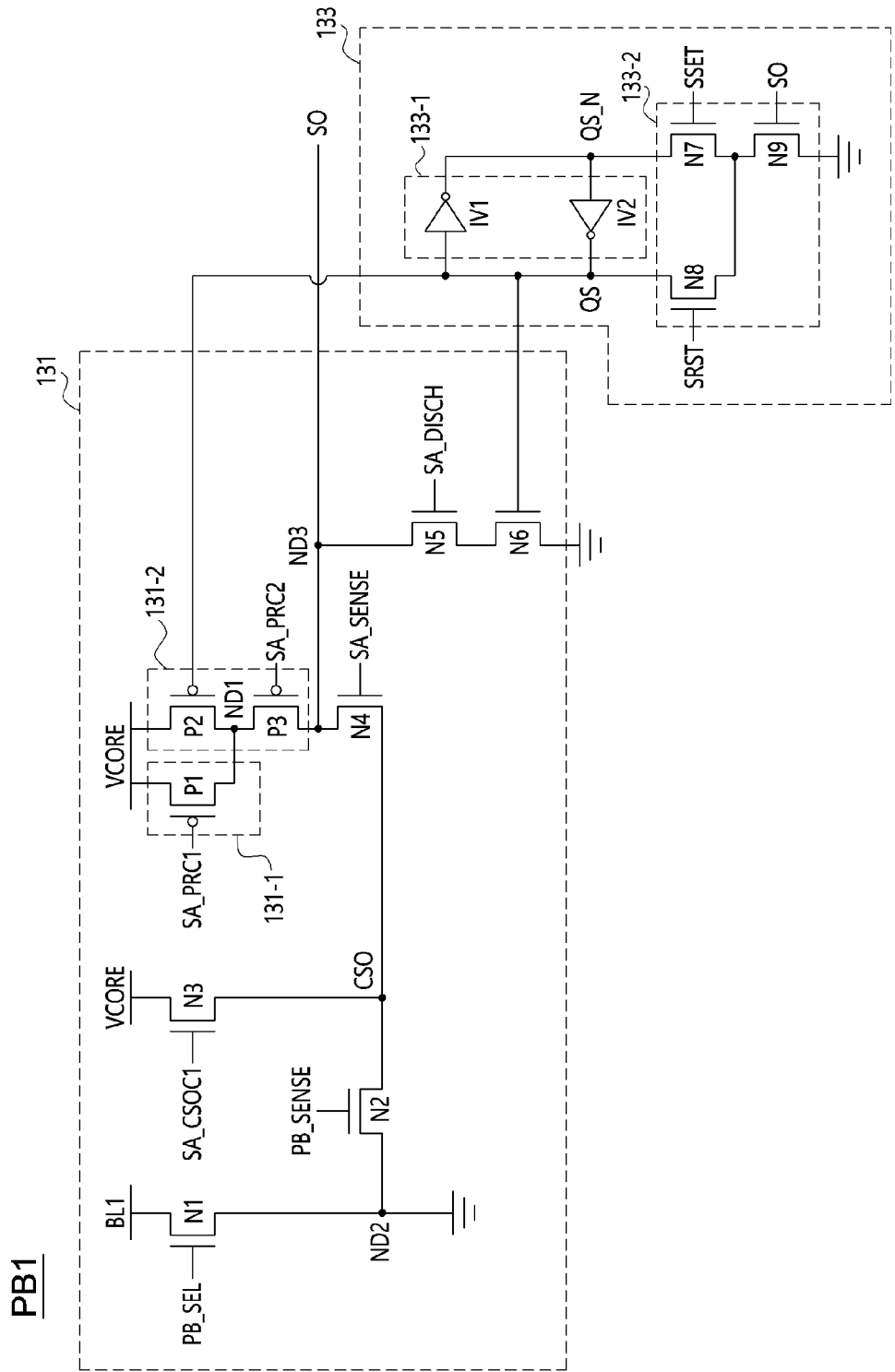
FIG. 4 is a diagram illustrating a configuration of a page buffer illustrated in FIG. 2.

FIG. 4 is a diagram illustrating a configuration of a page buffer PB1 illustrated in FIG. 2.

Referring to FIG. 4, the page buffer PB1 may include a bit line control unit 131 and an evaluation time amount setting unit 133 in accordance with an embodiment.

During a precharging operation for a read operation or a verification operation, the bit line control unit 131 may precharge a sensing node SO. During a sensing operation after the precharging operation, the bit line control unit 131 may control a voltage level of the sensing node SO based on a current amount of the bit line BL1, the current amount depending on a program state of a memory cell coupled to the bit line BL1.

In response to a first precharge signal SA_PRC1, the bit line control unit 131 may precharge a first node ND1 by utilizing a power voltage VCORE. In response to a second precharge signal SA_PRC2, the bit line control unit 131 may couple the first node ND1 and the sensing node SO to each other. The second precharge signal SA_PRC2 may be disabled at a different timing from the first precharge signal SA_PRC1. The second precharge signal SA_PRC2 may be set to be disabled later than the first precharge signal SA_PRC1. In response to an evaluation-setting value, the bit line control unit 131 may precharge the first node ND1 by utilizing the power voltage VCORE.

The bit line control unit 131 may include a first precharging unit 131-1, a second precharging unit 131-2 and a plurality of switching elements. The first precharging unit 131-1 may include a first transistor P1 coupled between the power voltage VCORE and the first node ND1. In response to the first precharge signal SA_PRC1, the first transistor P1 may precharge the first node ND1 by utilizing the power voltage VCORE.

The second precharging unit 131-2 may include a second transistor P2 and a third transistor P3. The second transistor P2 may be coupled in parallel with the first transistor P1 between the power voltage VCORE and the first node ND1. The third transistor P3 may be coupled between the first node ND1 and the sensing node SO. In response to the second precharge signal SA_PRC2, the third transistor P3 may couple the first node ND1 and the sensing node SO to each other, the second precharge signal SA_PRC2 being set to be disabled at a different timing from the first precharge signal SA_PRC1. The first precharge signal SA_PRC1 may be enabled at the same timing as or a different timing from the second precharge signal SA_PRC2. The second precharge signal SA_PRC2 may be disabled at a later timing than the first precharge signal SA_PRC1. In response to the evaluation-setting value, the second transistor P2 may precharge the first node ND1 by utilizing the power voltage VCORE.

The plurality of switching elements may include fourth to ninth transistors N1 to N6. The fourth transistor N1 may be coupled between the bit line BL1 and a second node ND2 and may couple the bit line BL1 and the second node ND2 to each other in response to a page buffer selecting signal PB_SEL. The fifth transistor N2 may be coupled between the second node ND2 and a common sensing node CSO and may couple the second node ND2 and the common sensing node CSO to each other in response to a page buffer sensing signal PB_SENSE. The sixth transistor N3 may be coupled between the power voltage VCORE and the common sensing node CSO and may precharge, in response to a common sensing control signal SA_CSOC1, the common sensing node CSO by utilizing the power voltage VCORE. The common sensing node CSO may be precharged to a voltage level lowered from the power voltage VCORE by a threshold voltage of the sixth transistor N3. The seventh transistor N4 may be coupled between the sensing node SO and the common sensing node CSO and may couple the sensing node SO and the common sensing node CSO to each other in response to a sensing signal SA_SENSE. During a sensing node precharging operation, as the seventh transistor N4 couples the common sensing node CSO and the sensing node SO to each other in response to the sensing signal SA_SENSE, the sensing node SO may be precharged to a voltage level lowered from the voltage level of the common sensing node CSO by the threshold voltage of the seventh transistor N4. The eighth transistor N5 may be coupled to a third node ND3 between the common sensing node CSO and the sensing node SO and may be turned on or off in response to a discharge signal SA_DISCH. The ninth transistor N6 may be coupled between the eighth transistor N5 and a ground power VSS and may be turned on or off in response to a voltage level of a latch-output node QS. For example, when the latch-output node QS has a voltage level of a logic high, the ninth transistor N6 may be turned on and therefore the eighth transistor N5 may discharge the sensing node SO in response to the discharge signal SA_DISCH.

The evaluation time amount setting unit 133 may include a latch 133-1 and a setting unit 133-2. The latch 133-1 may be configured to store therein an evaluation-setting value. The latch 133-1 may include inverters IV1 and IV2 that are coupled in parallel with each other and arranged in opposite directions between the latch-output nodes QS and QS_N. The setting unit 133-2 may be configured to set, to a first value or a second value according to evaluation control signals SSET and SRST, the evaluation-setting value to be stored in the latch 133-1. The first value may be of a logic high (1) and the second value may be of a logic low (0). The setting unit 133-2 may include a tenth transistor N7, an eleventh transistor N8 and a twelfth transistor N9. The tenth transistor N7 may be coupled to the latch-output node QS_N and may be turned on or off according to the evaluation control signal SSET. The eleventh transistor N8 may be coupled to the latch-output node QS and may be turned on or off according to the evaluation control signal SRST. The twelfth transistor N9 may be coupled to the tenth transistor N7 and the eleventh transistor N8 commonly at one end thereof, may be coupled to the ground power VSS at the other end thereof and may be turned on or off the voltage level of the sensing node SO. When the evaluation control signal SSET is generated to have a logic high level, the evaluation-setting value may be set to have a logic high level and therefore the voltage level of the latch-output node QS may be kept to a logic high level. When the evaluation control signal SRST is generated to have a logic high level, the evaluation-setting value may be set to have a logic low level and therefore the voltage level of the latch-output node QS may be kept to a logic low level.

At this time, a level of voltage applied to the bit line BL1 may be adjusted according to the level of the page buffer sensing signal PB_SENSE.

On the other hand, the bit line voltage control circuit 150 described with reference to FIG. 2 may utilize the page buffer sensing signal PB_SENSE as a signal for controlling the page buffers PB1 to PBm. That is, the bit line voltage control circuit 150 may adjust the level of bit line voltage applied to the bit line BL by adjusting the level of the page buffer sensing signal PB_SENSE under the control of the control circuit 140.

Figure 5:
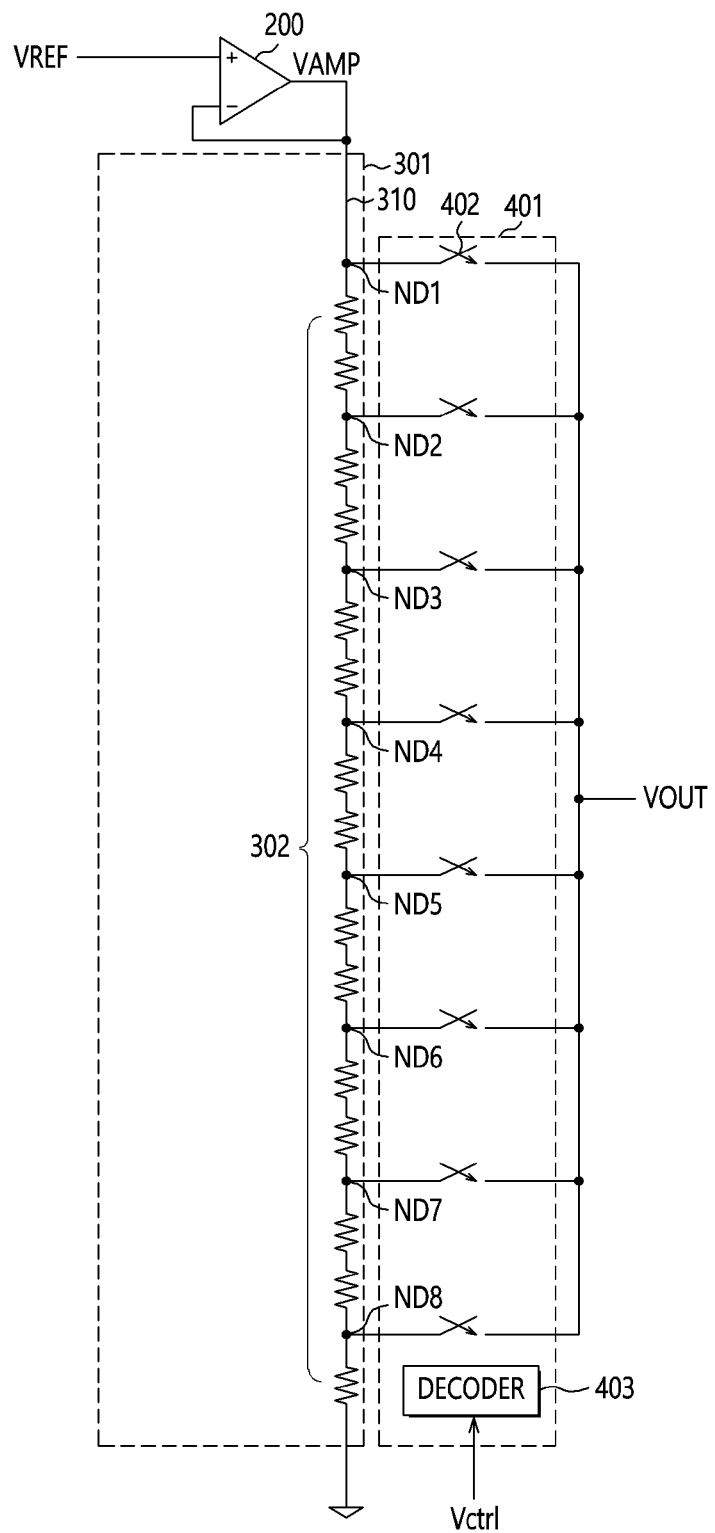
FIG. 5 is a diagram illustrating a configuration of a bit line voltage control circuit illustrated in FIG. 2.

Referring to FIG. 5, the bit line voltage control circuit 150 may be configured to adjust a level of an output voltage VOUT in response to a control signal Vctrl provided from the control circuit 140. The output voltage VOUT may be provided to the page buffers PB1 to PBm as the page buffer sensing signal PB_SENSE.

FIG. 5 is a diagram illustrating a configuration of the bit line voltage control circuit 150 illustrated in FIG. 2.

Referring to FIG. 5, the bit line voltage control circuit 150 may be configured to adjust a level of an output voltage VOUT in response to a control signal Vctrl provided from the control circuit 140. The output voltage VOUT may be provided to the page buffer 123 as the page buffer sensing signal PB_SENSE.

The bit line voltage control circuit 150 may include a differential amplifier 200, a resister array 301 and a multiplexer 401.

The differential amplifier 200 may receive a reference voltage VREF and an output of its own, i.e., an amplified voltage VAMP to keep the level of the amplified voltage VAMP to the level of the reference voltage VREF.

The resister array 301 may include a plurality of resistors 302 coupled between a ground node and a power node, i.e., an output node of the amplified voltage VAMP of the differential amplifier 200. A part of output nodes of the resister array 301 may be referred to as output nodes ND1 to ND8. Voltages may be output through the output nodes ND1 to ND8, the voltages being divided from the amplified voltage VAMP by different division ratios. For example, when resistance values of the plurality of resistors 302 are the same as one another, the voltage levels output from the respective output nodes ND1 to ND8 may correspond respectively to 8/8*VREF, 7/8*VREF, 6/8*VREF, 5/8*VREF, 4/8*VREF, 3/8*VREF, 2/8*VREF, 1/8*VREF in an order from the first output node ND1 to the eighth output node ND8, the first output node ND1 being most adjacent to the output node of the amplified voltage VAMP and the eighth output node ND8 being most adjacent to the ground node.

The multiplexer 401 may select one of the voltage levels of the output nodes ND1 to ND8 of the resister array 301 according to the voltage control signals Vctrl and may output the selected voltage level as the output voltage VOUT. The multiplexer 401 may include a plurality of voltage selecting switches 402 and a decoder 403. One end of each of the plurality of voltage selecting switches 402 may be coupled to a corresponding one of the output nodes ND1 to ND8 and the other end of each of the plurality of voltage selecting switches 402 may be coupled to the output voltage VOUT. The decoder 403 may decode the voltage control signals Vctrl and may couple, to the output voltage VOUT, one of the plurality of voltage selecting switches 402 according to a result of the decoding.

Figure 6:
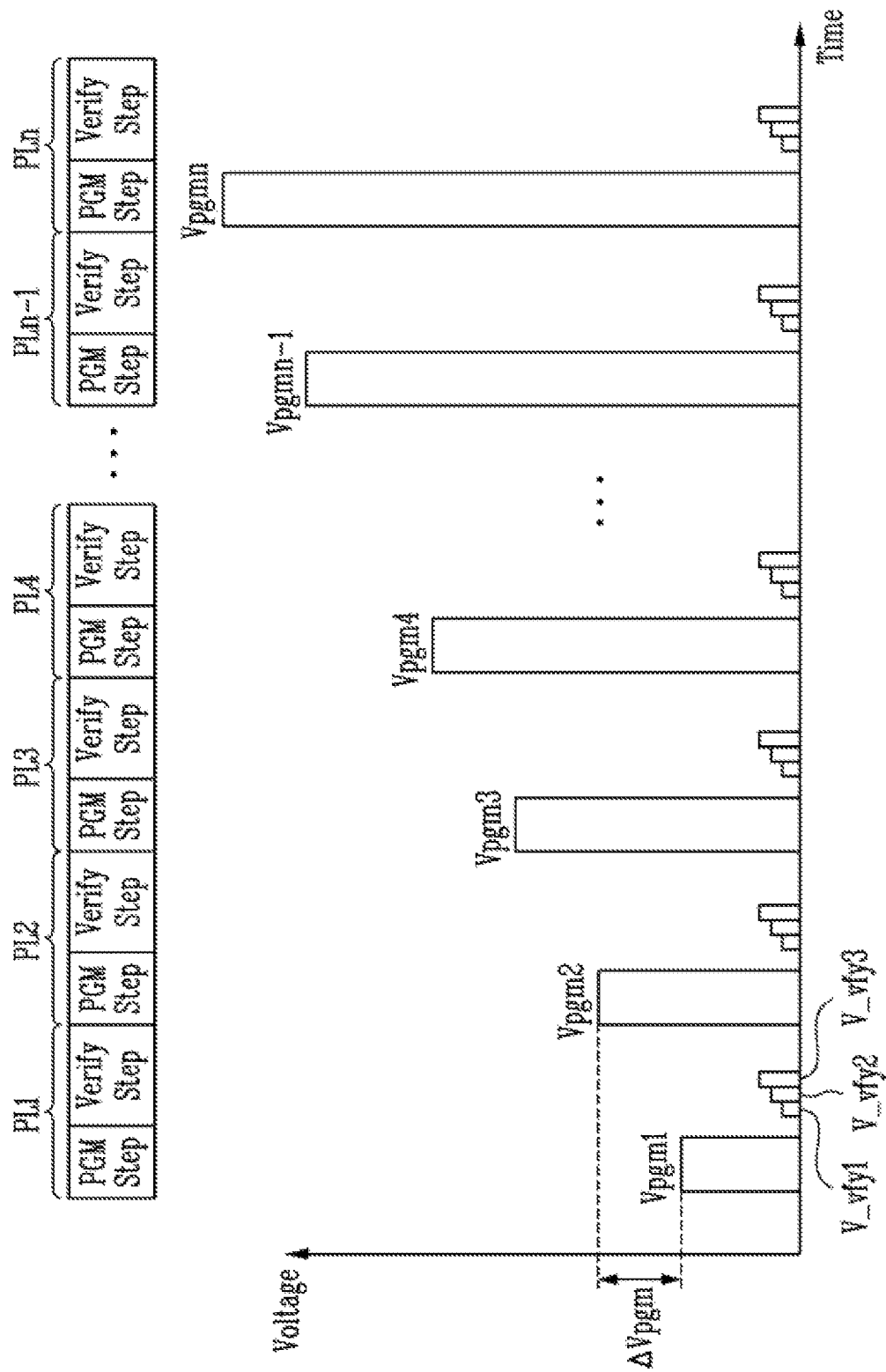
FIG. 6 is a diagram illustrating a program operation in accordance with an embodiment.

FIG. 6 is a diagram illustrating a program operation in accordance with an embodiment.

Referring to FIG. 6, the program operation may include a plurality of loops PL1 to PLn. By performing the plurality of loops PL1 to PLn, the semiconductor memory device 100 may program selected memory cells to have one of a plurality of program states.

Each of the plurality of loops PL1 to PLn may include a program voltage application step PGM Step and a verification step Verify Step. In the program voltage application step PGM Step, a program voltage may be applied to the memory cells. In the verification step Verify Step, verification voltages may be applied to the memory cells to determine whether the memory cells are programmed.

In the program voltage application step PGM Step, a program voltage application operation may be performed to apply a program voltage to a word line coupled to the selected memory cells. Through the program voltage application operation, the selected memory cells may be programmed to have one of first to n-th program states, 'n' being a natural number. As the plurality of loops PL1 to PLn are sequentially performed, the program voltage may increase or decrease stepwise by a step voltage. According to a setting value of the semiconductor memory device 100 or an external control, variously determined for each of the plurality of loops PL1 to PLn may be a number of times of applying the program voltages, a voltage level a voltage application duration and so forth.

A pass voltage may be applied to non-selected word lines other than the selected word line. A program-permission voltage may be applied to selected bit lines coupled to the memory cells, which are to be programmed. A program-inhibition voltage may be applied to non-selected bit lines.

In the program verification step, the semiconductor memory device 100 may apply a verification voltage to the selected word line and may apply a verification pass voltage to non-selected word lines. The semiconductor memory device 100 may sense a voltage or a current output through bit lines respectively coupled to memory cells coupled to the selected word line and may determine, based on a result of the sensing, whether the verification step is of pass or fail.

During the first loop PL1, first to third verification voltages V_vfy1 to V_vfy3 may be sequentially applied to the plurality of memory cells after application of a first program voltage Vpgm1 to the plurality of memory cells in order to verify the program states of the plurality of memory cells. Here, memory cells of which a target program state is a first program state may be verified by the first verification voltage V_vfy1, memory cells of which a target program state is a second program state may be verified by the second verification voltage V_vfy2 and memory cells of which a target program state is a third program state may be verified by the third verification voltage V_vfy3. The number of verification voltages will not be limited to this embodiment.

Memory cells which pass the verification according to the respective verification voltages V_vfy1 to V_vfy3 may be determined to have respective target program states and may be program-inhibited during the subsequent second loop PL2 and after. During the second loop PL2, a second program voltage Vpgm2 may be applied to the selected word line, the second program voltage Vpgm2 being higher than the first program voltage Vpgm1 by a unit voltage (ΔVpgm). Then, a verification operation may be performed in the same way as the verification operation in the first program loop PL1.

Hereinafter, described with reference to FIGS. 7 to 10 may be the first to third program control operation in accordance with an embodiment.

During a program operation, the memory cell array 110 may have coupling characteristics between word lines and bit lines thereof. Such coupling characteristics may affect program characteristics of the memory cell array 110. During a program operation, there may be a greater number of memory cells, which are to be programmed, than memory cells, which are to be program-inhibited, during a time amount corresponding to a former part of a plurality of loops and there may be a less number of memory cells, which are to be programmed, than memory cells, which are to be program-inhibited, during a time amount corresponding to a latter part of the plurality of loops. This phenomenon may cause change of the coupling characteristics and therefore degradation of the program characteristics.

In accordance with an embodiment, the plurality of loops may be divided into former loops and latter loops and at least one of the first program control operation, the second program control operation and the third program operation may be performed on the former loops and the latter loops. In a case of the first program control operation, the latter loops may be exemplarily configured by a loop, to which the pass voltage increment mode starts to be applied, and subsequent loops. In a case of the second program control operation and third program control operation, the latter loops may be exemplarily configured by a loop including a verification operation, in which the pass-determination Pass occurs, and subsequent loops.

Figure 7:
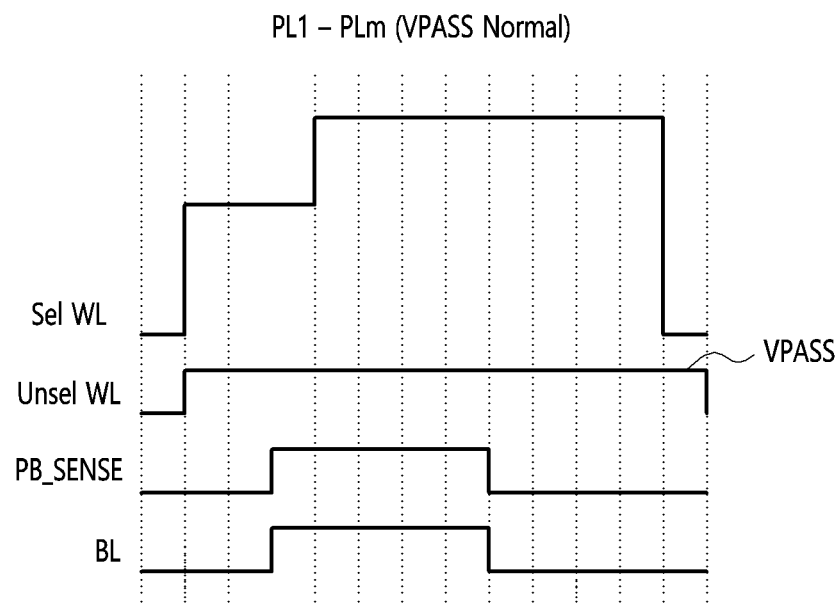
FIG. 7 is a diagram illustrating a first program control operation in accordance with an embodiment.
Figure 7:
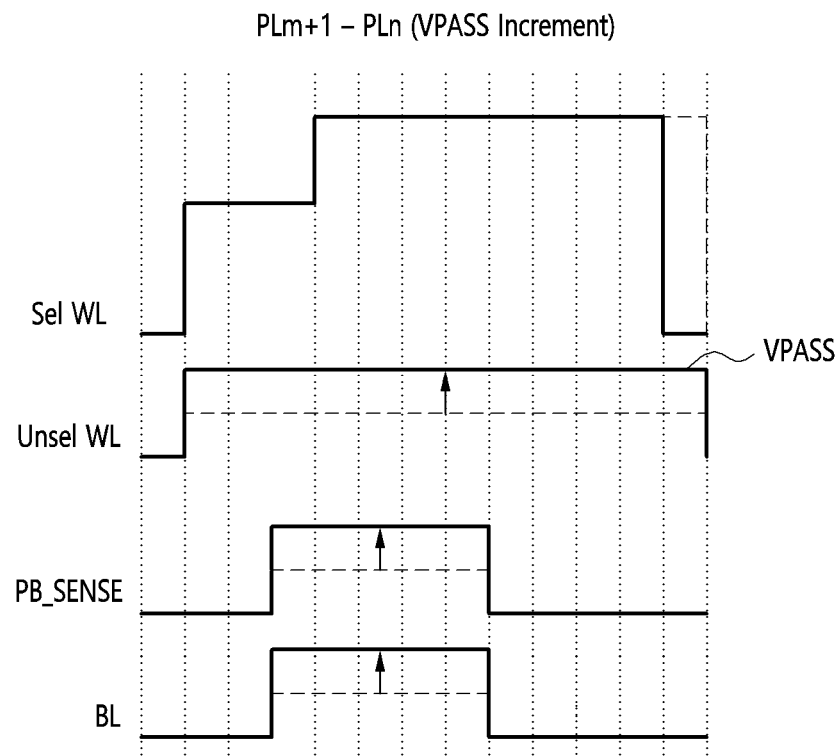

FIG. 7 is a diagram illustrating the first program control operation in accordance with an embodiment.

During a program operation, a program voltage may be applied to selected word lines Sel WL and a pass voltage VPASS may be applied to non-selected word lines Unsel WL.

The pass voltage VPASS having a predetermined level may be applied to the bit lines BL during the first to m-th loops PL1 to PLm among the first to n-th loops PL1 to PLn, the first to m-th loops PL1 to PLm being in the normal pass voltage mode VPASS Normal. The pass voltage VPASS having a higher level than the predetermined level may be applied to the bit lines BL during the (m+1)-th to n-th loops PLm+1 to PLn among the first to n-th loops PL1 to PLn, the (m+1)-th to n-th loops PLm+1 to PLn being in the pass voltage increment mode VPASS Increment. As described above, the voltage level to be applied to the bit line BL may be adjusted by adjusting the level of the page buffer sensing signal PB_SENSE. Increase of the voltage level of the bit line BL may be controlled to be proportional to variation of the pass voltage VPASS. For example, the increases of the voltage levels of the bit line BL, the page buffer sensing signal PB_SENSE, and the pass voltage VPASS is indicated by the arrows in FIG. 7.

As described above, in accordance with an embodiment, the program characteristics may be improved through the first program control operation on the loops in the pass voltage increment mode, the first program control operation being of increasing the level of bit line voltage in proportion to the increased pass voltage.

Figure 8:
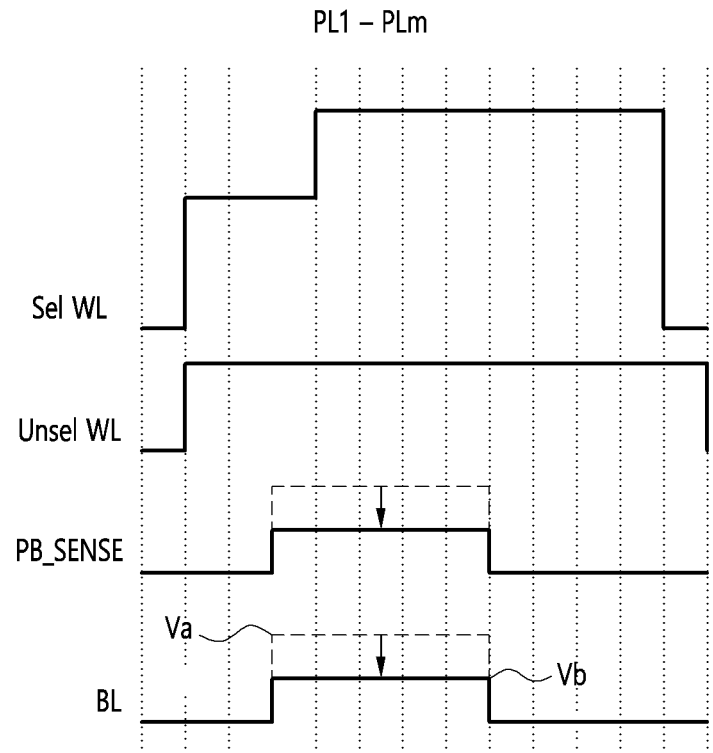
FIG. 8 is a diagram illustrating a second program control operation in accordance with an embodiment.
Figure 8:
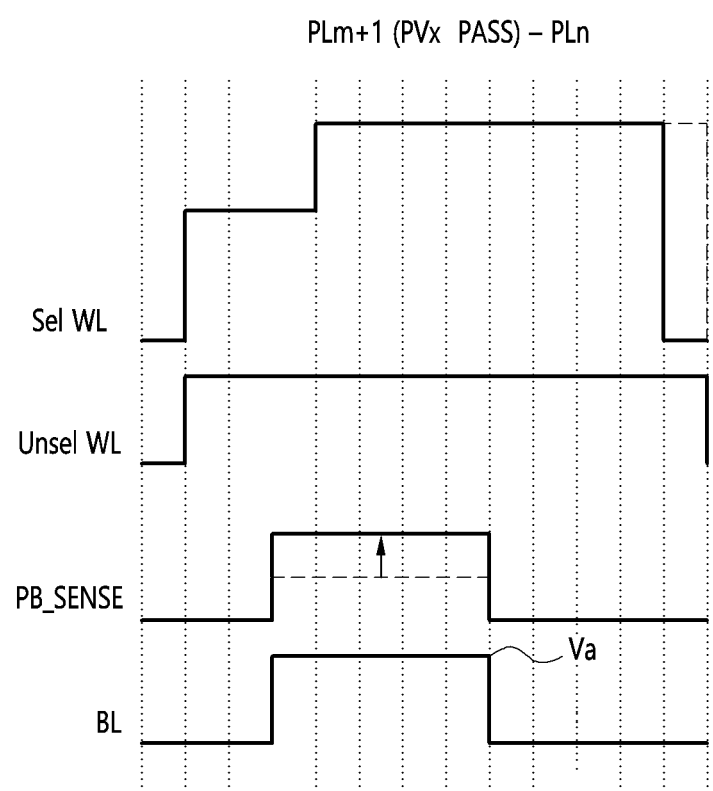

FIG. 8 is a diagram illustrating the second program control operation in accordance with an embodiment.

A bit line voltage having a lower level Vb than the predetermined level Va may be applied to the bit lines BL in the first to m-th loops PL1 to PLm, which are loops before the pass-determination occurs as a result of the verification operation among the first to n-th loops PL1 to PLn. A bit line voltage having the predetermined level Va may be applied to the bit lines BL in the (m+1)-th to n-th loops PLm+1 to PLn, which are a loop including a verification operation PVx, in which the pass-determination Pass occurs, and subsequent loops among the first to n-th loops PL1 to PLn.

As described above, in accordance with an embodiment, the second program control operation may be performed to apply the bit line voltage having a lower level than the predetermined level to the bit lines BL in the loops before the pass-determination occurs as a result of the verification operation. Further, the second program control operation may be performed to apply the bit line voltage having the predetermined level to the bit lines BL in the loop including the verification operation PVx, in which the pass-determination Pass occurs, and the subsequent loops. Therefore, in an embodiment, the program characteristics may be improved through the second program control operation.

Figure 9:
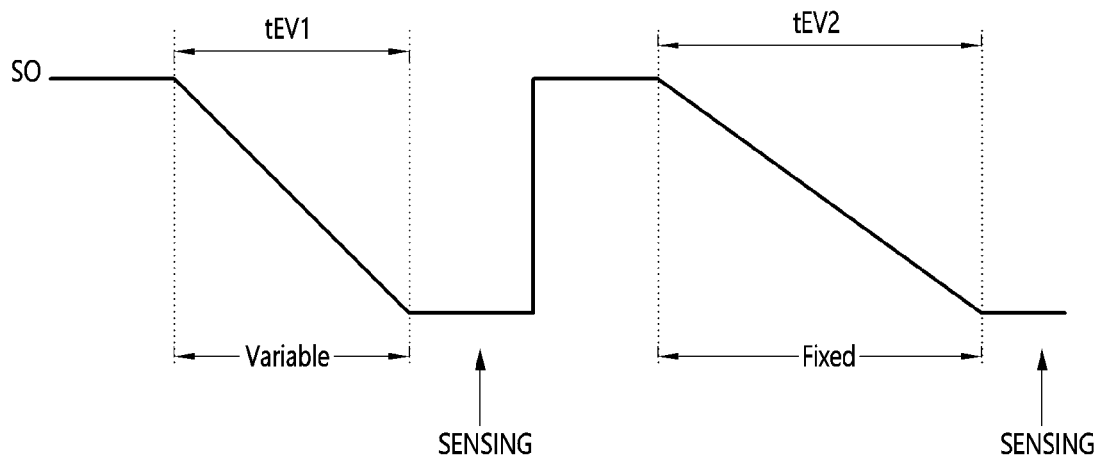
FIGS. 9 and 10 are diagrams illustrating a third program control operation in accordance with an embodiment.
Figure 10:
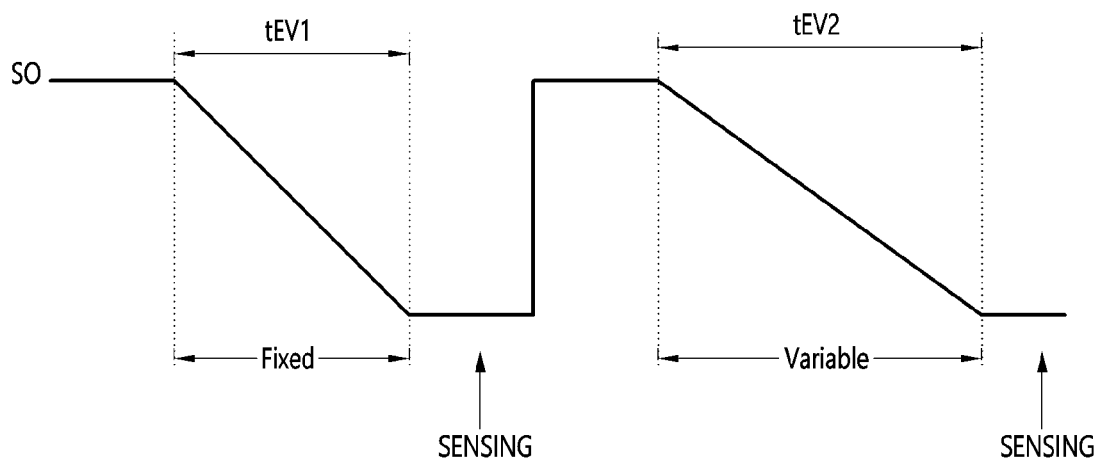

FIGS. 9 and 10 are diagrams illustrating the third program control operation in accordance with an embodiment.

In accordance with an embodiment, the third program control operation may be performed in a way illustrated in FIGS. 9 and 10.

Referring to FIG. 9, the first evaluation time amount tEV1 may be set to a first value for the first to m-th loops PL1 to PLm, which are loops before the pass-determination occurs as a result of the verification operation among the first to n-th loops PL1 to PLn, and may be set to a second value for the (m+1)-th to n-th loops PLm+1 to PLn among the first to n-th loops PL1 to PLn, the second value being less than the first value. In this case, the first evaluation time amount tEV1 may be less than the second evaluation time amount tEV2.

Referring to FIG. 10, the second evaluation time amount tEV2 may be set to a third value for the first to m-th loops PL1 to PLm, which are loops before the pass-determination occurs as a result of the verification operation among the first to n-th loops PL1 to PLn, and may be set to a fourth value for the (m+1)-th to n-th loops PLm+1 to PLn among the first to n-th loops PL1 to PLn, the fourth value being greater than the third value. In this case, the second evaluation time amount tEV2 may be greater than the first evaluation time amount tEV1.

As described above, in accordance with an embodiment, the third program control operation may be performed to vary one of the first evaluation time amount tEV1 and the second evaluation time amount tEV2 for the loops before the pass-determination occurs as a result of the verification operation. Therefore, in an embodiment, the program characteristics may be improved through the third program control operation.

While certain embodiments have been described above, it will be understood to those skilled in the art that the embodiments described are by way of example only. Accordingly, the semiconductor apparatus with program operation control should not be limited based on the described embodiments. Rather, the semiconductor apparatus with program operation control described herein should only be limited in light of the claims that follow when taken in conjunction with the above description and accompanying drawings.

What is claimed is:

1. A semiconductor apparatus comprising:
   a memory cell array; and
   control circuit configured to perform a program operation on target cells within the memory cell array, the program operation comprises a plurality of loops,
   wherein the control circuit is configured to perform, during the program operation, at least one of a first program control operation and a second program control operation,
   wherein the control circuit is configured to perform the first program control operation by applying a bit line voltage having a first predetermined level to bit lines in loops in which a pass voltage having a first level is applied among the plurality of loops, and by applying the bit line voltage having a higher level than the first predetermined level to the bit lines in loops in which the pass voltage having a second level higher than the first level is applied among the plurality of loops, and
   wherein the control circuit is configured to perform the second program control operation by applying the bit line voltage having a lower level than a second predetermined level to the bit lines in loops before pass-determination occurs as a result of a verification operation among the plurality of loops and by applying the bit line voltage having the second predetermined level to the bit lines in a loop in which the pass-determination occurs as the result of the verification operation and subsequent loops among the plurality of loops.

2. The semiconductor apparatus of claim 1, wherein each of the plurality of loops includes a program voltage application operation and a verification operation on the target cells within the memory cell array, the verification operation being an operation of verifying, by utilizing a plurality of verification voltages, whether the target cells are programmed.

3. The semiconductor apparatus of claim 2, wherein the control circuit is configured to apply a program voltage to word lines coupled to the target cells and configured to apply the pass voltage to word lines coupled to non-target cells, during the program operation.

4. The semiconductor apparatus of claim 1, wherein the program operation is a double verification program operation including a verification operation to be performed with two separate of verification voltage levels.

5. The semiconductor apparatus of claim 1, further comprising a page buffer coupled to the memory cell array through the bit lines and configured to adjust the level of the bit line voltage under a control of the control circuit.

6. A semiconductor apparatus comprising:
a memory cell array; and
control circuit configured to perform a program operation on target cells within the memory cell array, the program operation comprises a plurality of loops,
wherein the control circuit is configured to perform, during the program operation, at least one of a first program control operation, a second program control operation and a third program control operation,
wherein the control circuit is configured to perform the first program control operation by applying a bit line voltage having a first predetermined level to bit lines in loops in which a pass voltage having a first level is applied among the plurality of loops, and by applying the bit line voltage having a higher level than the first predetermined level to the bit lines in loops in which the pass voltage having a second level higher than the first level is applied among the plurality of loops,
wherein the control circuit is configured to perform the second program control operation by applying the bit line voltage having a lower level than a second predetermined level to the bit lines in loops before pass-determination occurs among the plurality of loops and by applying the bit line voltage having the second predetermined level to the bit lines in a loop in which the pass-determination occurs and subsequent loops among the plurality of loops, and
wherein the control circuit is configured to perform the third program control operation by varying at least one of a first evaluation time amount for a first verification operation and a second evaluation time amount for a second verification operation, the first verification operation and the second verification operation being included in a double verification operation performed in the plurality of loops.

7. The semiconductor apparatus of claim 6, wherein the control circuit is configured to perform the third program control operation by setting the first evaluation time amount to a first value for loops before pass-determination occurs among the plurality of loops and by setting the first evaluation time amount to a second value for a loop in which the pass-determination occurs and subsequent loops among the plurality of loops, the second value being less than the first value.

8. The semiconductor apparatus of claim 6, wherein the control circuit is configured to perform the third program control operation by setting the second evaluation time amount to a first value for loops before pass-determination occurs among the plurality of loops and by setting the second evaluation time amount to a second value for a loop in which the pass-determination occurs and subsequent loops among the plurality of loops, the second value being greater than the first value.

9. The semiconductor apparatus of claim 6, wherein each of the plurality of loops includes a program voltage application operation and a verification operation on the target cells within the memory cell array, the verification operation being an operation of verifying, by utilizing a plurality of verification voltages, whether the target cells are programmed.

10. The semiconductor apparatus of claim 9, wherein the control circuit is configured to apply a program voltage to word lines coupled to the target cells and configured to apply the pass voltage to word lines coupled to non-target cells, during the program operation.

11. The semiconductor apparatus of claim 6, wherein the program operation is a double verification program operation including a verification operation to be performed with two separate verification voltage levels.

12. The semiconductor apparatus of claim 6, further comprising a page buffer coupled to the memory cell array through the bit lines and configured to adjust the level of the bit line voltage under a control of the control circuit.

* * * * *